(12) United States Patent
Mennie et al.

(10) Patent No.: US 7,137,274 B2
(45) Date of Patent: Nov. 21, 2006

(54) SYSTEM FOR LIQUEFYING OR FREEZING XENON

(75) Inventors: Darren Mennie, Portishead (GB); Ron Clark Lee, Bloomsbury, NJ (US); Colin Michael Harrison, Norton St Philip (GB); Makoto Kaneko, Putney Hill (GB); Joanne Rachel Greenwood, Hove (GB)

(73) Assignee: The BOC Group plc, Windlesham (GB)

( * ) Notice: Subject to any disclaimer, the term of this patent is extended or adjusted under 35 U.S.C. 154(b) by 365 days.

(21) Appl. No.: 10/669,834

(22) Filed: Sep. 24, 2003

(65) Prior Publication Data
US 2005/0061028 A1   Mar. 24, 2005

(51) Int. Cl.
*F25J 1/00* (2006.01)

(52) U.S. Cl. .......................................... 62/601; 62/606

(58) Field of Classification Search ................. 62/601, 62/606
See application file for complete search history.

(56) References Cited

U.S. PATENT DOCUMENTS

| | | | | |
|---|---|---|---|---|
| 1,199,700 A * | 9/1916 | Hildebrandt | ............... | 62/606 |
| 2,909,903 A | 10/1959 | Zimmerman | | |
| 3,378,351 A * | 4/1968 | Ruehrwein et al. | ........... | 62/601 |
| 4,333,753 A | 6/1982 | Kuraoka | | |
| 4,417,909 A * | 11/1983 | Weltmer, Jr. | ................ | 62/648 |
| 5,577,092 A | 11/1996 | Kublak et al. | | |
| 6,105,885 A * | 8/2000 | Haas et al. | ................. | 239/589 |
| 6,134,914 A * | 10/2000 | Eschwey et al. | ............. | 62/637 |
| 6,194,733 B1 | 2/2001 | Haas et al. | | |
| 6,324,256 B1 | 11/2001 | McGregor et al. | | |
| 2001/0042839 A1 | 11/2001 | Haas et al. | | |
| 2002/0035836 A1* | 3/2002 | Driehuys et al. | ............ | 62/51.1 |
| 2002/0051358 A1 | 5/2002 | Haas et al. | | |
| 2004/0071266 A1 | 4/2004 | Orsini et al. | | |

FOREIGN PATENT DOCUMENTS

| | | |
|---|---|---|
| CA | 2 170 584 | 8/1997 |
| EP | 1 150 169 B1 | 10/2001 |
| EP | 1 418 796 A2 | 5/2004 |
| EP | 1 420 296 A2 | 5/2004 |
| GB | 2 358 912 A | 8/2001 |
| WO | WO 99/51356 A1 | 10/1999 |
| WO | WO 02/19781 A1 | 3/2002 |

OTHER PUBLICATIONS

United Kingdom Search Report for Application No. GB0329026.9; Date of search: Dec. 7, 2004—(1).
PCT International Search Report for International Application No. PCT/GB2004/003888; Date of mailing of International Search Report: Feb. 11, 2005.

* cited by examiner

*Primary Examiner*—William C. Doerrler
(74) *Attorney, Agent, or Firm*—Ira Lee Zebrak; Mary K. Nicholes

(57) ABSTRACT

Apparatus for producing liquid or solid xenon comprises a duct 12 having an inlet 14 for receiving gaseous xenon and an outlet 16 for outputting gaseous xenon at a reduced temperature to a nozzle located in a vacuum chamber 60. A housing 18 extends about the duct and contains a halocarbon coolant in thermal contact with the duct, and a second duct 24 in thermal contact with the halocarbon coolant for conveying a flow of liquid nitrogen through the housing 18 to control the temperature of the halocarbon. In view of the difference in the pressure of the xenon gas output from the duct and the pressure in the chamber, the thus-cooled gas is caused to liquefy or solidify in the vicinity of the nozzle.

24 Claims, 2 Drawing Sheets

SYSTEM FOR LIQUEFYING OR FREEZING XENON

BACKGROUND OF THE INVENTION

The invention relates to a system for producing a flow of liquid or solid xenon, and also to apparatus for, and a method of, cooling a fluid flow, for example of an inert gas such as xenon, to produce a target for the generation of extreme ultra violet (EUV) radiation.

Extreme ultra violet lithography (EUVL) extends the current technology of optical lithography by using wavelengths in the range from 11 to 14 nm, in order to offer a reduction in the size of printable features during the manufacture of integrated circuits. A known method for the generation of EUV radiation for EUVL is the focussing of an electrical discharge or a laser beam onto a target. Targets are typically formed from metal, such as tin or lithium, or from an inert gas, such as xenon. However, the use of a metal target can result in the evaporation of undesirable debris, such as small particles, atoms and ions, from the surface of the target, which debris may be deposited on sensitive optical components used to focus the beam on the target. The use of metal targets also requires relatively complex optical systems to focus the laser beam over the target surface. These problems may be overcome through the use of an inert gas such as xenon as the target material.

In systems that use xenon as the target material for the generation of EUV radiation, a stream of xenon is emitted from a nozzle into a chamber. As the EUV radiation has a poor transmissibility through xenon, it is necessary to employ a pumping system to generate a reduced pressure in the vicinity of the site at which the xenon plasma is to be generated. Furthermore, the distance between the nozzle and the plasma site should be of sufficient magnitude so as to avoid ablation of the nozzle by the laser beam. In practice, the location of this site is dependent on the density of the stream output from the nozzle; as the density of the output stream is increased, so the distance between the nozzle and the plasma site can be increased.

It is an object of at least the preferred embodiment of the invention to provide apparatus to enable the site at which xenon plasma is generated to be sufficiently spaced from the nozzle that nozzle damage is minimised.

One problem associated with the use of xenon as the target material for the generation of EUV radiation lies in the relatively high cost of the material in comparison to metallic targets, due to the occurrence of xenon in atmospheric air in very low concentrations (around 0.087 ppm). It is therefore another object of at least the preferred embodiment of the invention to provide a system that enables xenon to be retrieved from the evacuated chamber and re-circulated for return to the chamber.

SUMMARY OF THE INVENTION

In one aspect, the present invention provides a system for producing a flow of liquid or solid xenon in an evacuated chamber, the system comprising pump means for drawing a flow of gaseous xenon from the chamber, means for pressurising the gaseous flow, and means for cooling the pressurised gaseous flow for return to the chamber, whereby the gaseous xenon returned to the chamber is caused to liquefy or solidify within the chamber.

Thus, the invention can enable the recirculation of xenon using a pumping system, a compressor, and an apparatus, such as a cryogenic lance, for liquefying or solidifying the recirculated xenon. This can significantly reduce production costs, by recirculating the expensive xenon gas, whilst increasing the density of the xenon target in the chamber; for example a stream of xenon in a liquid form has a density of around 3057 kg/m$^3$ (at normal pressure and boiling temperature), whilst gaseous xenon has a density of around 5.54 kg/m$^3$ (at normal pressure and room temperature). With regard to solid xenon, density varies with both temperature and pressure, but is higher than that of liquid xenon at normal pressure and boiling temperature. The relatively high densities of liquid and solid xenon can enable the distance between the site at which a xenon plasma is generated and the entry point of the xenon into the chamber to be of a sufficient magnitude (typically at least ten millimeters) so as to minimise the amount of debris generated during plasma generation.

The pressurising and cooling of the gaseous xenon to provide a liquid or solid stream of xenon may be provided in isolation from the recirculation of the gaseous xenon, and therefore the invention also provides a system for producing a flow of liquid or solid xenon in an evacuated chamber, the system comprising means for pressuring and cooling a gaseous flow of xenon to a pressure and a temperature so that upon entering the evacuated chamber, the gaseous xenon liquefies or solidifies within the chamber.

Preferably, the pump means is arranged to create a pressure in the chamber in the range from atmospheric pressure to an ultra high vacuum of around $10^{-11}$ mbar, preferably in the range from 1000 mbar to $10^{-10}$ mbar and more preferably in the range from 1000 mbar to $10^{-3}$ mbar. The flow rate of xenon into the chamber can be as high as several (say, 4) slpm with a chamber pressure in the range from 1000 mbar to $10^{-3}$ mbar.

The system preferably comprises means for controlling the cooling means such that the temperature of the pressurised gaseous flow returned to the chamber is in the range from ambient temperature to −150° C., more preferably in the range from −50° C. to −110° C. Within this temperature range, with the chamber at or around atmospheric pressure, a stream of liquid xenon will enter the chamber, whilst at pressures below atmospheric pressure, a stream of solid xenon will enter the chamber.

The pressurising means is preferably arranged to pressurise the gaseous flow to a pressure within the range from 1 to 100 bar, more preferably in the range from 40 to 60 bar.

In one preferred arrangement the cooling means comprises a housing extending about a duct having an inlet for receiving the pressurised gaseous flow and an outlet for returning the flow to the chamber, the housing containing at least one coolant for cooling the flow. The housing preferably contains a first coolant in thermal contact with the duct and means extending about the duct for conveying within the housing a flow of second coolant for controlling the temperature of the first coolant. This can enable the temperature of the gaseous xenon emitted from the duct to be carefully controlled.

Preferably, the housing comprises a first section and a second section, smaller than the first section, proximate the outlet, the first section containing the means for conveying the second coolant within the housing.

The present invention also provides apparatus for cooling a flow of fluid, such as a flow of an inert gas, the apparatus comprising a duct having an inlet for receiving the fluid flow and an outlet, and a housing extending about the duct, the housing containing a first coolant in thermal contact with the duct for cooling the fluid flow, the housing comprising a first section and a second section, smaller than the first section, proximate the outlet, the first section containing means in thermal contact with the first coolant for conveying within the housing a flow of a second coolant for controlling the temperature of the first coolant.

Preferably, the first section has a greater external diameter than the second section. In the preferred embodiment, the first section has an external diameter of around 63.5 mm (2.5") and the second section has an external diameter of around 19 mm (0.75").

Preferably, the conveying means comprises a second duct extending about the first-mentioned duct. In a preferred embodiment, the second duct comprises a helical duct having an inlet proximate the inlet to the first duct and an outlet proximate the second section of the housing.

Preferably, the second section of the housing has a length in the direction of fluid flow through the duct in the range from 0.25 m to 1.5 m, preferably in the range from 0.4 m to 0.75 m.

Preferably, the first coolant comprises a halocarbon ($CF_4$), preferably carbon tetrafluoride, and the second coolant preferably comprises liquid nitrogen. Preferably, the apparatus comprising means for supplying liquid nitrogen from a source to said conveying means. Preferably, the distance between the source of liquid nitrogen and the housing is less than 1 m. The apparatus may comprise means for controlling the rate of flow of the second coolant within the conveying means, in order to control the temperature of the first coolant and thus the rate of cooling of the fluid flowing through the duct.

Preferably, the outlet has means for attaching thereto a nozzle for emitting a stream of fluid therefrom.

The preferred embodiment of the cooling means is thus in the form of a cryogenic lance, the function of which is based on that of a thermosyphon heat exchanger. Within the lance, received gaseous xenon is isolated from the external atmosphere and exposed to an isothermal environment produced by a surrounding halocarbon-14 (carbon tetrafluoride) bath. The halocarbon-14 (H-14) is controlled in a two-phase (liquid-vapour) state by indirect cooling with liquid nitrogen. In this thermodynamic state, the H-14 will be at a completely uniform temperature, which is adjustable within limits. The liquid level of H-14 is based on the initial charge (mass) of H-14 within the lance and the operating temperature. Desirably, the liquid level is maintained at approximately the intersection between the first and second sections of the housing of the lance.

The present invention also provides apparatus for producing a flow of liquid or solid xenon in a chamber, comprising a first duct having an inlet for receiving a pressurised flow of gaseous xenon, a housing extending about the duct, the housing containing a first coolant in thermal contact with the duct for cooling the gaseous xenon and a second duct in thermal contact with the first coolant for conveying through the housing a flow of second coolant for controlling the temperature of the first coolant, the duct having an outlet for outputting the gaseous flow to the chamber wherein, in use, the difference between the pressure in the chamber and the pressure of the gaseous flow is such that the flow is caused to liquefy or solidify within the chamber.

The present invention further provides a method of producing a flow of liquid or solid xenon in an evacuated chamber, the method comprising drawing a flow of gaseous xenon from the chamber, pressurising the gaseous flow, cooling the pressurised gaseous flow and returning the thus-cooled and pressurised gaseous flow to the chamber, whereby the gaseous xenon returned to the chamber is caused to liquefy or solidify within the chamber.

The present invention also provides a method of cooling a flow of fluid, comprising causing the fluid to flow through a duct having an inlet for receiving the fluid flow and an outlet for emitting the flow from the duct, a housing extending about the duct and containing a first coolant in thermal contact with the duct for cooling the fluid flow, the housing comprising a first section and a second section, smaller than the first section, proximate the outlet, the method also comprising conveying though the first section of the housing a flow of a second coolant to control the temperature of the first coolant.

The invention further provides a method of producing a flow of liquid or solid xenon, the method comprising cooling a gaseous flow of xenon by supplying the flow to a duct having a housing extending thereabout and containing a first coolant in thermal contact with the duct for cooling the gaseous flow, and conveying though the housing a flow of second coolant in thermal contact with the first coolant to control the temperature of the first coolant, and outputting from the outlet a flow of gaseous xenon to a chamber wherein the pressure is such that the flow is caused to liquefy or solidify within the chamber.

BRIEF DESCRIPTION OF THE DRAWINGS

Preferred features of the present invention will now be described, by way of example only, with reference to the accompanying drawings, in which.

DETAILED DESCRIPTION OF THE INVENTION

Figure 1:
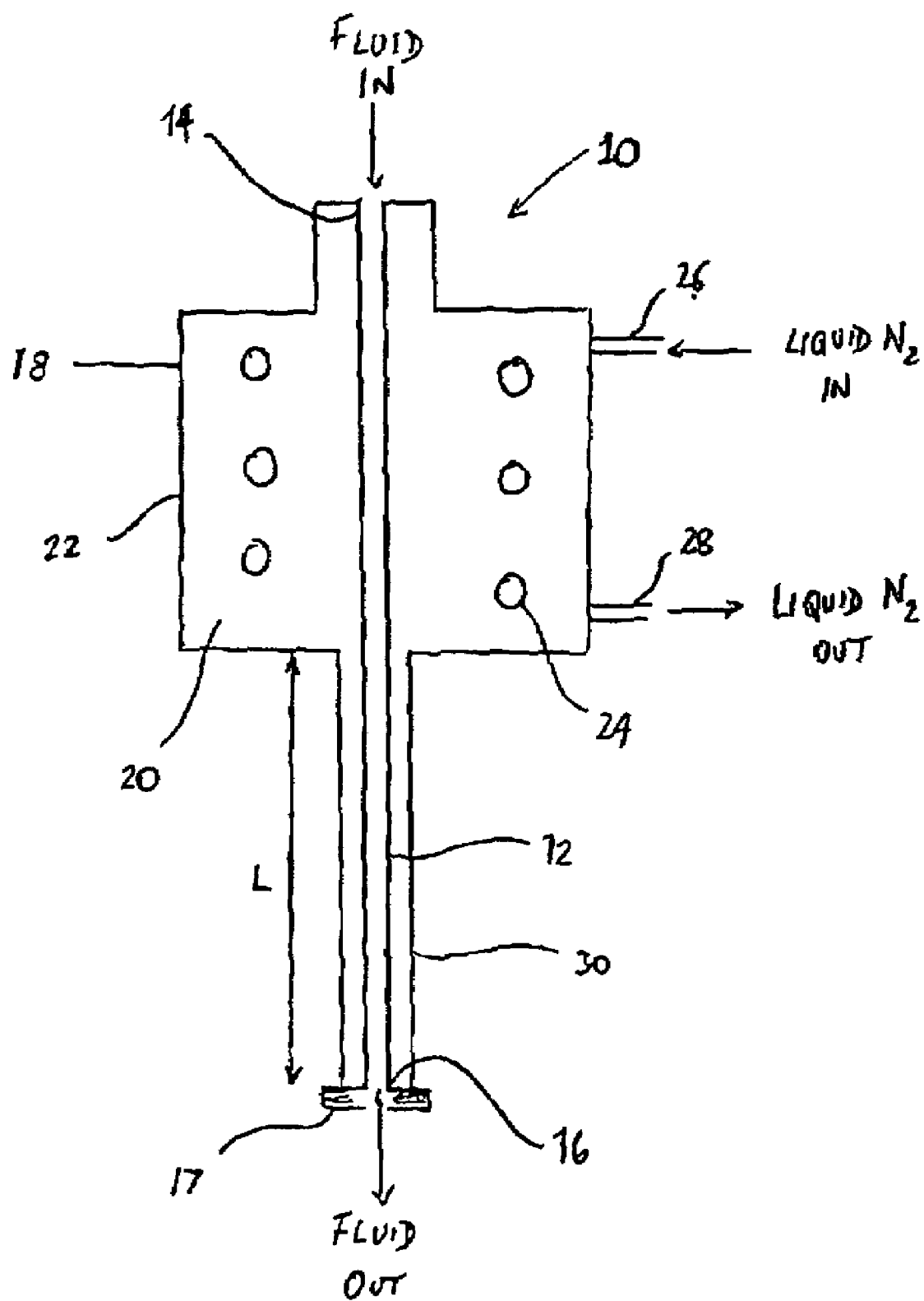
FIG. 1 illustrates an apparatus for cooling the flow of inert gas.

With reference to FIG. 1, an embodiment of an apparatus for cooling a flow of fluid such as gaseous xenon is in the form of a lance 10 comprising a duct 12 having an inlet 14 for receiving a flow of fluid and an outlet 16 from which the cooled fluid is emitted from the lance. The outlet 16 has a means 17, such as a VCR threaded connector or the like, for attaching a nozzle thereto. In a preferred embodiment, the duct 12 has a bore of diameter around 3.175 mm.

Figure 2:
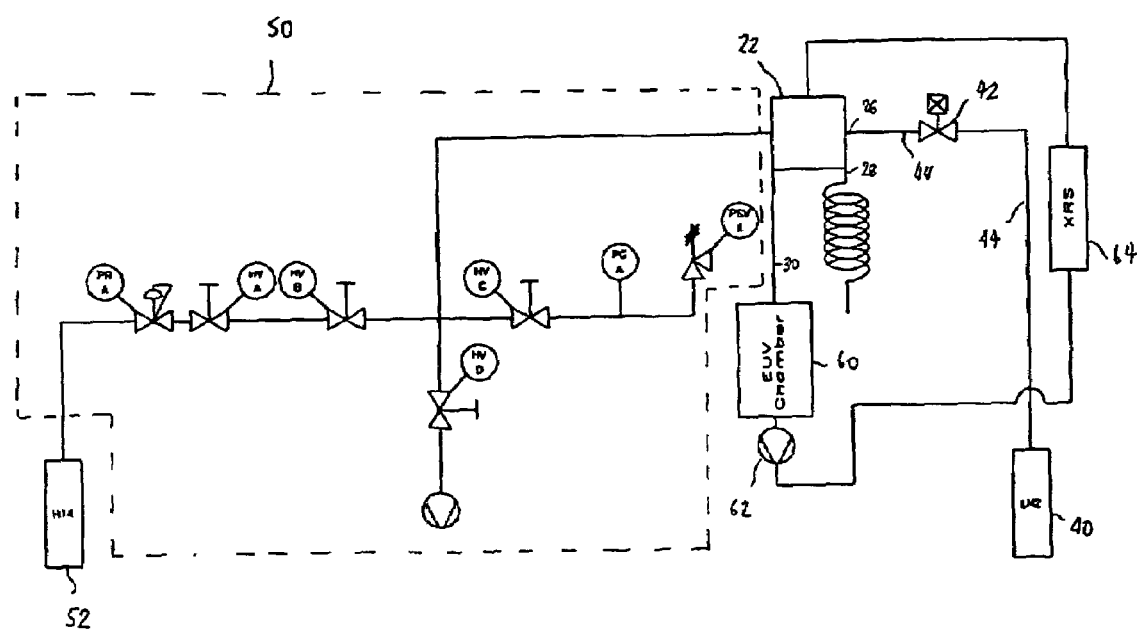
FIG. 2 illustrates schematically a system including the apparatus of FIG. 1 for supplying the inert gas to a chamber.

A sealed housing 18 extends around the duct 12 and contains a first coolant 20, such as a halocarbon, for example halocarbon-14 (carbon tetrafluoride) in thermal contact with the duct 12 for cooling a flow of fluid within the duct 12. The housing 18 has a first section 22 containing a helical duct 24 extending around the duct 12. The duct 24 has an inlet 26 located in the wall of the first section 22 of the housing 18 for receiving a flow of a second coolant, such as liquid nitrogen, for controlling the temperature of the first coolant 20. The duct 24 has an outlet 28 also located in the wall of the first section 22 of the housing 18 for allowing the flow of liquid nitrogen to be output from the housing to the atmosphere. In the preferred embodiment, the duct 24 has a bore of diameter around 0.62 mm. With reference to FIG. 2, the liquid nitrogen coolant is supplied from a source 40 of liquid nitrogen at a pressure of around 0.7 MPa connected to the inlet 26 via a solenoid valve 42 in close proximity to the inlet 26 for controlling the flow of liquid nitrogen through the duct, and thus controlling the temperature of the first coolant 20 within the housing. In the preferred embodiment, the length of the piping 44 connecting the source 40 to the inlet 26 is less than 1 meter.

Returning to FIG. 1, the housing 18 further has a second section 30 of a smaller size than the first section 22; in the embodiment shown in FIG. 1, the second section 30 has a smaller diameter than the first section 22. In a preferred embodiment, the diameter of the first duct is 3.175 mm, and the diameter of the second duct is 0.62 mm. In this embodiment, the second section 30 of the housing 18 has a length L of around 0.5 m, with the first section having a length of around 0.3 m.

FIG. 2 also illustrates an arrangement 50 comprising, inter alia, valves and a pump, for supplying the first coolant from a source 52 to the housing 18. Once filled with the first coolant, the housing 18 is sealed to prevent leakage of the first coolant therefrom. The arrangement 50 allows the pressure of the first coolant 20 within the housing 18 to be controlled during filling of the housing in order to obtain the desired cooling of the gaseous flow during use. In practice, the housing 18 is charged with a mass of halocarbon-14 (H-14) sufficient to ensure that the liquid level of H-14 within the housing 18 is around the intersection between the first and second sections of the housing 18 when operating at the optimum operating temperature (the "design point") of around −90° C. to −95° C.

The outlet 16 of the duct 12 enters an EUV radiation chamber 60. The chamber 60 contains apparatus for generating an electron or laser beam and for focussing the beam on an EUV source, namely a stream of xenon entering the chamber 60 from a nozzle (not shown) of diameter generally less than 100 μm attached to the outlet 16. Suitable apparatus is well known in the art and will not be discussed further. An arrangement of one or more pumps 62, for example a turbo-molecular pump and backing pump, is provided in fluid communication with the chamber 60. A xenon recycling system (XRS) 64 is connected to the pump arrangement 62 for receiving the gaseous xenon from the pump and returning the gaseous xenon to the lance 10. Thus, the apparatus has an integral recirculation path for the xenon used as the EUV source. In practice, the recirculation path is initially filled from a source of xenon, such as a bottle or canister.

In use, the pump arrangement 62 extracts gaseous xenon from the chamber 60 to maintain a pressure in the chamber desirably in the range from 1000 mbar to $10^{-10}$ mbar, preferably in the range from $10^{-1}$ mbar to $10^{-5}$ mbar, and exhausts the gaseous xenon at atmospheric pressure to the XRS 64. The XRS 64 contains a series of filters for filtering the received gaseous xenon to remove any contaminants or other materials used in the chamber 60, and a compressor for compressing the received gaseous xenon to a pressure in the range from 1 bar to 100 bar, preferably to around 50 bar. The pressurised gaseous xenon enters the duct 12 of the lance 10 within which it is cooled by the halocarbon-14 and liquid nitrogen coolants within the housing 18, and is emitted from the outlet 16 of the duct at a temperature of around −90° C.±0.5° C. and a pressure of around 50 bar. The thus-cooled pressurised gaseous xenon is emitted into the evacuated chamber 60 through the nozzle attached to the outlet, where, due to the pressure difference between the outlet 16 and the chamber 60, the xenon rapidly cools to produce a stream or filament of solid xenon which flows into the chamber to provide a target for the generation of EUV radiation. The filament of xenon returns to a gaseous form within the chamber 60, from which it is removed by the pump arrangement 62 and recirculated via XRS 64 and lance 10 for recirculation and return to the chamber 60 in solid form.

The lance is capable of operating at temperature other than the target temperature of around −90° C. to −95° C., but in practice this is restricted at the lower extreme by the freezing or triple point of xenon (−111.8° C.), and the upper extreme by "dryout" of the lance 10. At the upper extreme for this embodiment (around −73° C.), the liquid level will drop to about 60% of its colder (−93° C.) operating level. Dryout will occur at around −50° C. to −60° C., the actual temperature being dependent on the specific gas-liquid volume ratios at the design point.

In summary, apparatus for producing liquid or solid xenon comprises a duct having an inlet for receiving gaseous xenon and an outlet for outputting gaseous xenon at a reduced temperature to a nozzle located in a vacuum chamber. A housing extends about the duct and contains a halocarbon coolant in thermal contact with the duct, the housing comprising a first section and a second section, smaller than the first section, proximate the outlet, the first section containing a second duct in thermal contact with the halocarbon coolant for conveying through the housing a flow of liquid nitrogen for controlling the temperature of the halocarbon. In view of the difference in the pressure of the xenon gas output from the duct and the pressure in the chamber, the thus-cooled gas is caused to liquefy or solidify in the vicinity of the nozzle.

It is to be understood that the foregoing represents one embodiment of the invention, others of which will no doubt occur to the skilled addressee without departing from the true scope of the invention as defined by the claims appended hereto.

For example, a heater or other source of heat could be provided around the second section 30 of the housing 12 in order to provide additional control and accuracy of the temperature of the stream of xenon output from the lance 10. In such an embodiment, the accuracy of the xenon temperature control is improved and this heat source could also be used to speed up the evacuation of the EUV chamber at the termination of use.

The invention claimed is:

1. A system for producing a flow of liquid or solid xenon in an evacuated chamber comprising:
   means for pressuring and cooling a gaseous flow of xenon to a pressure and a temperature so that upon entering the evacuated chamber, the gaseous xenon liquefies or solidifies within the chamber;
   pump means for drawing the flow of gaseous xenon from the chamber to the pressurising and cooling means; and
   means for returning the pressurised and cooled gaseous xenon to the chamber wherein the pressuring and cooling means comprises a housing extending about a duct having an inlet for receiving the pressurised gaseous flow and an outlet for returning the flow to the chamber, the housing containing at least one coolant for cooling the flow and wherein the housing contains a first coolant in thermal contact with the duct and means extending about the duct for conveying a flow of second coolant within the housing for controlling the temperature of the first coolant.

2. A system for producing a flow of liquid or solid xenon in an evacuated chamber comprising:
   means for pressuring and cooling a gaseous flow of xenon to a pressure and a temperature so that upon entering the evacuated chamber, the gaseous xenon liquefies or solidifies within the chamber;
   pump means for drawing the flow of gaseous xenon from the chamber to the pressurising and cooling means; and
   means for returning the pressurised and cooled gaseous xenon to the chamber wherein the housing contains a first coolant in thermal contact with the duct and means extending about the duct for conveying a flow of second coolant within the housing for controlling the temperature of the first coolant.

3. The system as claimed in claim 2, wherein the housing comprises a first section and a second section, smaller than the first section, proximate the outlet, the first section containing the means for conveying the second coolant within the housing.

4. The system as claimed in claim 3, wherein the first section has a greater external diameter than the second section.

5. The system as claimed in claim 2, wherein the conveying means comprises a second duct extending about the first-mentioned duet.

6. The system as claimed in claim 5, wherein the second duct comprises a helical duct having an inlet proximate the inlet to the first duct and an outlet proximate the second section of the housing.

7. The system as claimed in claim 3, wherein the second section of the housing has a length in the direction of fluid flow through the duct in the range from 0.25 m to 1.5 m.

8. The system as claimed in claim 2, wherein the second coolant comprises a liquid coolant.

9. The system as claimed in claim 8, wherein said liquid coolant comprises liquid nitrogen.

10. The system as claimed in claim 2, comprising means for controlling the rate of flow of said second coolant within said conveying means.

11. A system for producing a flow of liquid or solid xenon in an evacuated chamber comprising:
    pump means for drawing a flow of gaseous xenon from the chamber;
    means for pressurising the gaseous flow; and
    means for cooling the pressurised gaseous flow for return to the chamber, whereby the gaseous xenon returned to the chamber is caused to liquefy or solidify within the chamber wherein the cooling means comprises a housing extending about a duct having an inlet for receiving the pressurised gaseous flow and an outlet for returning the flow to the chamber, the housing containing at least one coolant for cooling the flow and wherein the housing contains a first coolant in thermal contact with the duct and means extending about the duct for conveying a flow of second coolant within the housing for controlling the temperature of the first coolant.

12. A system for producing a flow of liquid or solid xenon in an evacuated chamber comprising:
    pump means for drawing a flow of gaseous xenon from the chamber;
    means for pressurising the gaseous flow; and
    means for cooling the pressurised gaseous flow for return to the chamber, whereby the gaseous xenon returned to the chamber is caused to liquefy or solidify within the chamber and wherein the housing contains a first coolant in thermal contact with the duct and means extending about the duct for conveying a flow of second coolant within the housing for controlling the temperature of the first coolant.

13. The system as claimed in claim 12, wherein the housing comprises a first section and a second section, smaller than the first section, proximate the outlet, the first section containing the means for conveying the second coolant within the housing.

14. The system as claimed in claim 13, wherein the first section has a greater external diameter than the second section.

15. The system as claimed in claim 14, wherein the conveying means comprises a second duct extending about the first-mentioned duct.

16. The system as claimed in claim 15, wherein the second duct comprises a helical duct having an inlet proximate the inlet to the first duct and an outlet proximate the second section of the housing.

17. The system as claimed in claim 16, wherein the second section of the housing has a length in the direction of fluid flow through the duct in the range from 0.25 m to 1.5 m.

18. The system as claimed in claim 13, wherein the first coolant comprises a halocarbon.

19. The system as claimed in claim 18 wherein said halocarbon comprises tetrafluoromethane.

20. The system as claimed in claim 13, wherein the second coolant comprises a liquid coolant.

21. The system as claimed in claim 20 wherein said liquid coolant comprises liquid nitrogen.

22. The system as claimed in claim 20, comprising means for controlling the rate of flow of said second coolant within said conveying means.

23. The system as claimed in claim 16, wherein the outlet has means for attaching a nozzle thereto.

24. An apparatus for cooling a flow of fluid comprising:
    a duct having an inlet for receiving the fluid flow and an outlet;
    a housing extending about the duct, the housing containing a first coolant in thermal contact with the duct for cooling the fluid flow, the housing comprising a first section and a second section, smaller than the first section, proximate the outlet, the first section containing means in thermal contact with the first coolant for conveying within the housing a flow of a second coolant for controlling the temperature of the first coolant; and
    means for controlling the rate of flow of said second coolant within said conveying means.

* * * * *